(12) United States Patent
Sato et al.

(10) Patent No.: US 9,362,520 B2
(45) Date of Patent: Jun. 7, 2016

(54) ORGANIC ELECTROLUMINESCENCE DISPLAY DEVICE HAVING A CONDUCTIVE ORGANIC LAYER IN CONTACT WITH AN UPPER ELECTRODE

(71) Applicant: Japan Display Inc., Tokyo (JP)

(72) Inventors: Toshihiro Sato, Tokyo (JP); Hironori Toyoda, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/503,444

(22) Filed: Oct. 1, 2014

(65) Prior Publication Data

US 2015/0221895 A1    Aug. 6, 2015

(30) Foreign Application Priority Data

Oct. 1, 2013  (JP) ................. 2013-206170

(51) Int. Cl.
| | | |
|---|---|---|
| H01J 1/62 | (2006.01) | |
| H01L 51/52 | (2006.01) | |
| H01L 27/32 | (2006.01) | |
| H01L 51/50 | (2006.01) | |

(52) U.S. Cl.
CPC ......... *H01L 51/5234* (2013.01); *H01L 27/3211* (2013.01); *H01L 51/5044* (2013.01); *H01L 51/5253* (2013.01)

(58) Field of Classification Search
CPC ............ H01L 51/5278; H01L 27/3251; H01L 51/5221; H01L 27/3258; H01L 51/5253; H01L 51/5206; H01L 51/504; H01L 27/3211
USPC .................................................. 313/504, 506
See application file for complete search history.

(56) References Cited

U.S. PATENT DOCUMENTS

| | | | |
|---|---|---|---|
| 2006/0214565 A1* | 9/2006 | Luo et al. ................... | 313/504 |
| 2015/0200378 A1* | 7/2015 | Reusch et al. ............ | 313/504 |
| 2015/0228701 A1 | 8/2015 | Oh | |

FOREIGN PATENT DOCUMENTS

| | | | |
|---|---|---|---|
| JP | 2006-253044 A | 9/2006 | |
| JP | 2008-511100 A | 4/2008 | |
| JP | 2010-27504 A | 2/2010 | |
| KR | 10-2010-0053534 A | 5/2010 | |
| KR | 10-2011-0136885 A | 12/2011 | |
| KR | 10-2012-0042435 A | 5/2012 | |

(Continued)

OTHER PUBLICATIONS

Korean Office Action mailed Jan. 7, 2016, for corresponding Korean Patent Application No. 10-2014-0131823.

(Continued)

*Primary Examiner* — Joseph L Williams
(74) *Attorney, Agent, or Firm* — Typha IP LLC

(57) ABSTRACT

An organic electroluminescence display device includes: a lower electrode that is made of a conductive inorganic material and formed in each of pixels arranged in a matrix in a display area; a light-emitting organic layer that is in contact with the lower electrode and made of a plurality of different organic material layers including a light-emitting layer emitting light; an upper electrode that is in contact with the light-emitting organic layer, formed so as to cover the whole of the display area, and made of a conductive inorganic material; and a conductive organic layer that is in contact with the upper electrode, formed so as to cover the whole of the display area, and made of a conductive organic material.

14 Claims, 12 Drawing Sheets

(56) References Cited

FOREIGN PATENT DOCUMENTS

| | | |
|---|---|---|
| TW | 201203648 A | 1/2012 |
| WO | 2006/023322 A1 | 3/2006 |

OTHER PUBLICATIONS

Taiwanese Office Action mailed Jan. 28, 2016, for corresponding Taiwanese Patent Application No. 103131037.

* cited by examiner

ORGANIC ELECTROLUMINESCENCE DISPLAY DEVICE HAVING A CONDUCTIVE ORGANIC LAYER IN CONTACT WITH AN UPPER ELECTRODE

CROSS-REFERENCE TO RELATED APPLICATION

The present application claims priority from Japanese application JP 2013-206170 filed on Oct. 1, 2013, the content of which is hereby incorporated by reference into this application.

BACKGROUND OF THE INVENTION

1. Field of the Invention

The present invention relates to an organic electroluminescence display device.

2. Description of the Related Art

In recent years, image display devices (hereinafter referred to as "organic EL (Electro-Luminescence) display devices") using a self-luminous body called an organic light-emitting diode (OLED) have been put to practical use. Since the self-luminous body is used, the organic EL display devices are superior in terms of visibility and response speed, compared to a related-art liquid crystal display device, and in addition, a further reduction in thickness is possible because an auxiliary lighting device such as a backlight is not necessary.

In a so-called top-emission display device of the organic EL display devices, light is emitted toward the side of a substrate on which elements are formed. In the top-emission display device, an upper electrode of the upper electrode and a lower electrode as two electrodes that interpose an organic layer including a light-emitting layer therebetween is an electrode that covers the whole surface of a display area where the organic layer is formed, and is formed of a transparent conductive material. The upper electrode is desirably formed thinner for improving the light transmittance. However, as the upper electrode becomes thinner, the resistance value rises and a voltage drop occurs. For this reason, unevenness of luminance is likely to occur between an edge portion of the display area and a central portion of the display area.

In an organic EL display device disclosed in JP 2010-027504 A, a routed wiring provided in a non-display area on the outside of a display area of a sealing substrate that is arranged to face an element substrate is connected with a cathode of the element substrate, for achieving the low resistance of a cathode as an upper electrode and achieving a narrow picture-frame. Moreover, in an organic EL display device disclosed in JP 2008-511100 A, when two or more light-emitting layers of different colors are stacked to emit light, an intermediate connection layer is provided between the light-emitting layers.

SUMMARY OF THE INVENTION

It is considered that the above-described organic EL display devices are effective for achieving the low resistance of the cathode. However, the manufacturing process is complicated, and it is difficult to eliminate the unevenness of luminance between the edge portion of the display area and the central portion of the display area.

The invention has been made in view of the circumstances described above, and it is an object of the invention to provide an organic EL display device in which the low resistance of an upper electrode formed on the whole surface of a display area is achieved without complicating the manufacturing process.

An organic EL display device according to an aspect of the invention includes: a lower electrode that is made of a conductive inorganic material and formed in each of sub-pixels arranged in a matrix in a display area; a light-emitting organic layer that is in contact with the lower electrode and made of a plurality of different organic material layers including a light-emitting layer emitting light; an upper electrode that is in contact with the light-emitting organic layer, formed so as to cover the whole of the display area, and made of a conductive inorganic material; and a conductive organic layer that is in contact with the upper electrode, formed so as to cover the whole of the display area, and made of a conductive organic material.

In the organic EL display device according to the aspect of the invention, the conductive organic layer may be formed on the inside of the upper electrode in a plan view.

The organic EL display device according to the aspect of the invention may further include, on the conductive organic layer, a sealing film that covers the outsides of the conductive organic layer and the upper electrode in the plan view and is made of an inorganic material.

In the organic EL display device according to the aspect of the invention, the conductive organic layer may planarize irregularities of the upper electrode.

The organic EL display device according to the aspect of the invention may further include a conductive inorganic film that is in contact with a surface of the conductive organic layer on the side opposite to a surface thereof on which the upper electrode is formed, formed to cover the whole of the display area, and made of a conductive inorganic material.

In the organic EL display device according to the aspect of the invention, the conductive organic layer may be formed of a charge generation layer.

In the organic EL display device according to the aspect of the invention, the light-emitting organic layer may have a configuration in which a plurality of the light-emitting layers are disposed in a tandem arrangement, and a charge generation layer may be arranged between the plurality of light-emitting layers.

In the organic EL display device according to the aspect of the invention, an inorganic substance for increasing conductivity may be added to a material of the conductive organic layer.

In the organic EL display device according to the aspect of the invention, the conductive organic layer may include ions injected after deposition.

DETAILED DESCRIPTION OF THE INVENTION

Figure 1:
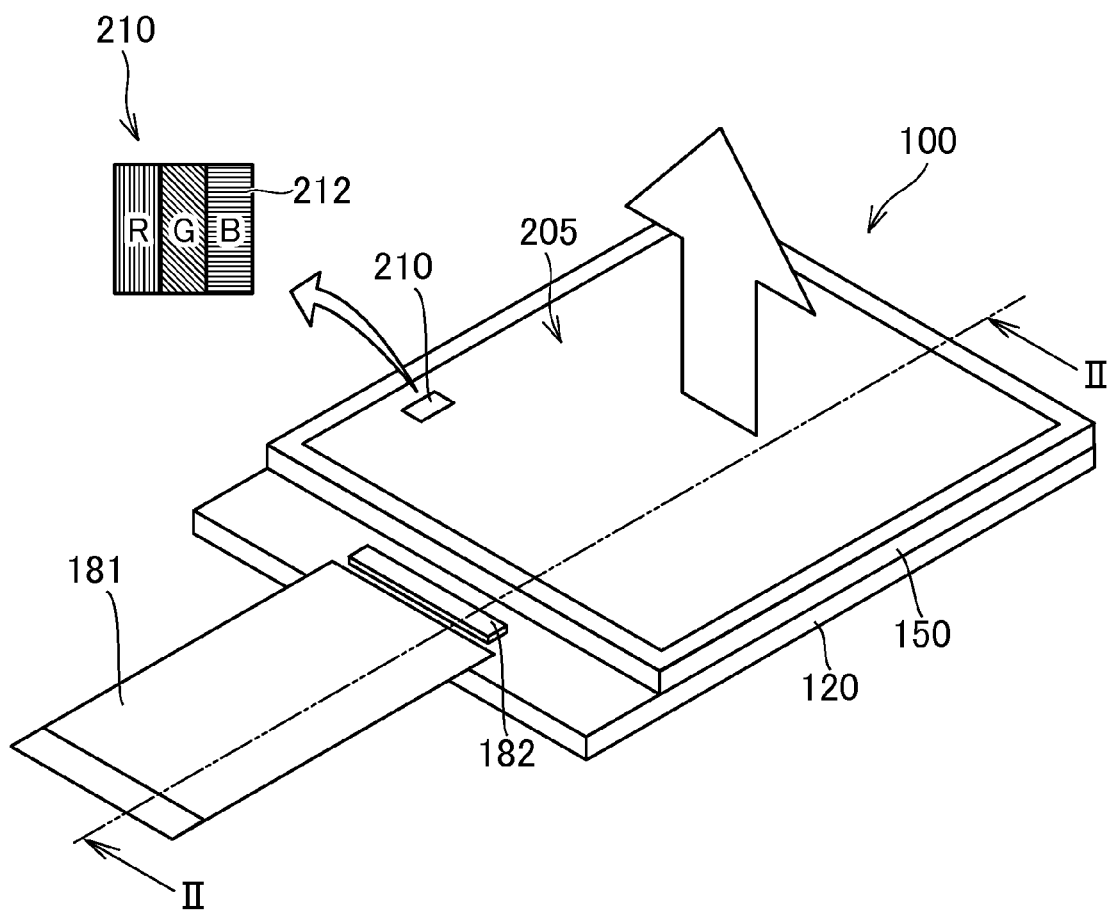
FIG. 1 is a diagram schematically showing an organic electroluminescence display device according to an embodiment of the invention.

Hereinafter, an embodiment of the invention will be described with reference to the drawings. In the drawings, the same or equivalent elements are denoted by the same reference numerals and signs, and a redundant description is omitted.

FIG. 1 schematically shows an organic electroluminescence display device 100 according to the embodiment of the invention. As shown in the drawing, the organic electroluminescence display device 100 includes two substrates, a TFT (Thin Film Transistor) substrate 120 and a counter substrate 150, between which a transparent resin filler 221 (refer to FIG. 2) is sealed. A display area 205 composed of pixels 210 arranged in a matrix is formed in the TFT substrate 120 and the counter substrate 150 of the organic electroluminescence display device 100. The pixel 210 is composed of three sub-pixels 212 from which lights corresponding to three colors of R (red), G (green), and B (blue) are emitted.

A driver IC (Integrated Circuit) 182 as a driver circuit that applies, to a scanning signal line of a pixel transistor arranged in each of the pixels 210, a potential for providing electrical continuity between the source and drain of the pixel transistor, and also applies, to a data signal line of each of the pixel transistors, a voltage corresponding to the gray-scale value of the pixel is placed on the TFT substrate 120. Moreover, an FPC (Flexible Printed Circuit) 181 for inputting image signals or the like from the outside is attached to the TFT substrate 120. In the embodiment, each of the sub-pixels 212 includes an organic electroluminescence element that emits white light, and the lights having wavelength ranges corresponding to the respective colors are emitted using color filters corresponding to the respective colors and arranged on the counter substrate 150. However, a configuration may be adopted in which each of the pixels includes an OLED that emits a different color of light. Moreover, in the embodiment, the organic electroluminescence display device 100 is a top-emission type organic electroluminescence display device that emits light toward the side of the TFT substrate 120 on which a light-emitting layer is formed, as indicated by the arrow in the drawing. However, the organic electroluminescence display device 100 may be a bottom-emission type organic electroluminescence display device.

Figure 2:
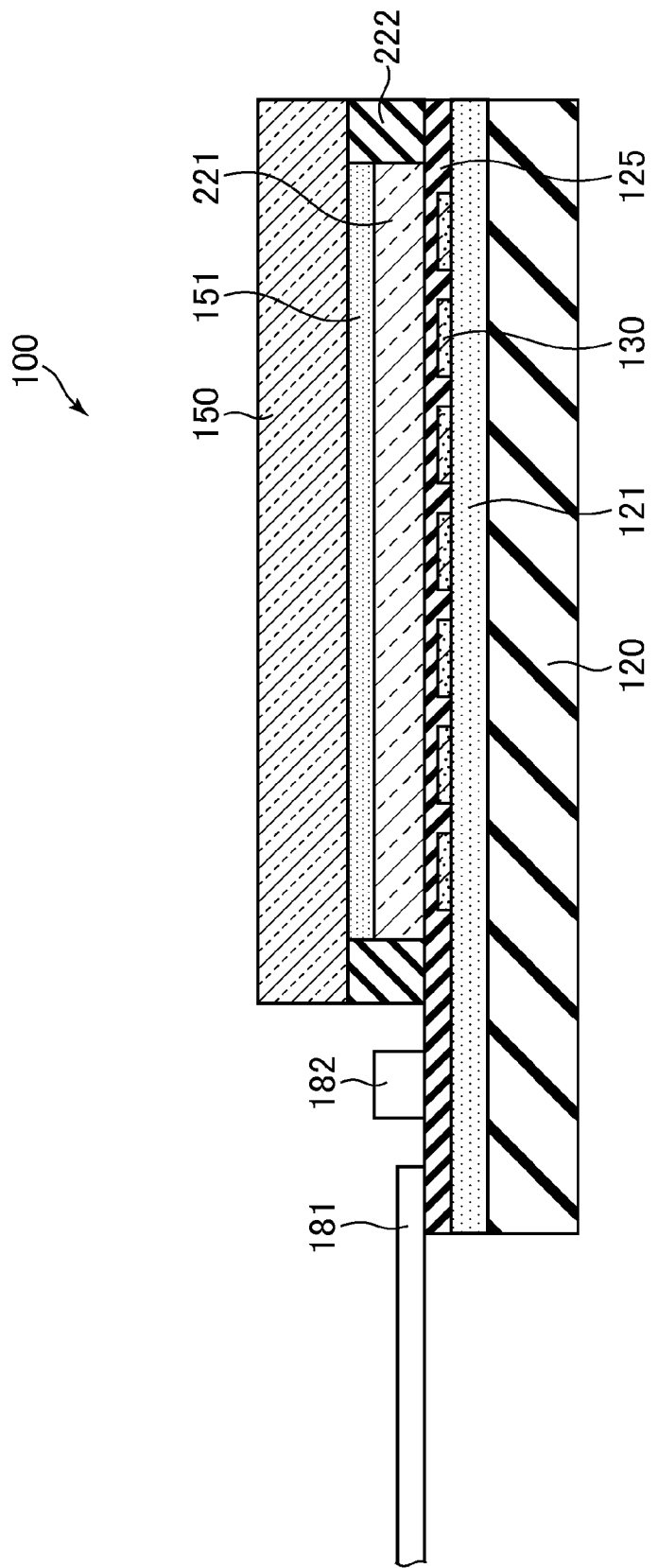
FIG. 2 is a diagram schematically showing a cross-section taken along the II-II in FIG. 1.

FIG. 2 is a diagram schematically showing a cross-section taken along the II-II in FIG. 1. As shown in the cross-sectional view, a TFT circuit layer 121 in which TFT circuits are formed, a plurality of organic electroluminescence elements 130 formed on the TFT circuit layer 121, and a sealing film 125 covering the organic electroluminescence elements 130 to block moisture are formed on the TFT substrate 120. The organic electroluminescence elements 130 as many as the sub-pixels 212 are formed. However, some of the organic electroluminescence elements 130 are omitted in FIG. 2 for facilitating the description. A color filter and black matrix layer 151 including R, G, and B color filters and a black matrix as a light-shielding film that blocks light emitted through each boundary between the sub-pixels 212 is formed on the counter substrate 150. The filler 221 between the TFT substrate 120 and the counter substrate 150 is sealed by a sealant 222.

Figure 3:
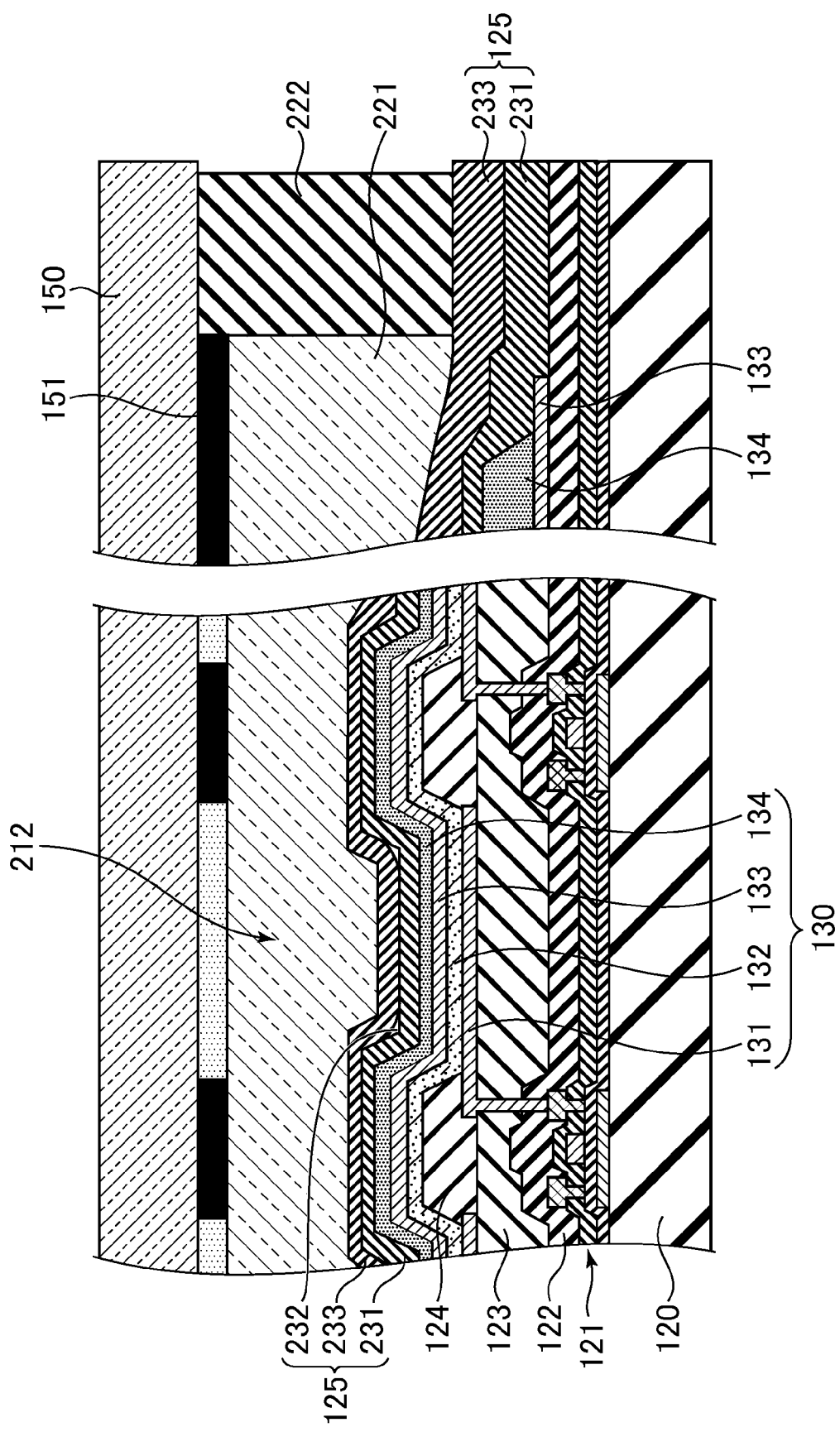
FIG. 3 is a diagram showing detailed configurations of a cross-section of a sub-pixel and a cross-section of an edge portion.

FIG. 3 is a diagram showing detailed configurations of a cross-section of the sub-pixel 212 of the organic electroluminescence display device 100 and a cross-section of an edge portion of the organic electroluminescence display device 100. As shown in the drawing, the sub-pixel 212 includes: a passivation film 122 formed on the TFT circuit layer 121 on the TFT substrate 120; a planarization film 123 made of an organic material and formed on the passivation film 122; a lower electrode 131 formed on the planarization film 123 and electrically connected with an electrode of the TFT circuit layer 121; a pixel separation film 124 made of an insulating film and covering an edge portion of the lower electrode 131 to thereby separate the sub-pixels 212 from each other; a light-emitting organic layer 132 formed on the lower electrode 131 and the pixel separation film 124 so as to cover the display area 205 and including an organic layer including a light-emitting layer; an upper electrode 133 formed on the light-emitting organic layer 132 so as to cover the display area 205 and made of a transparent conductive film such as of ITO (Indium Tin Oxide); a conductive organic film 134 formed so as to be in contact with the upper electrode 133 and made of a conductive organic material; and the sealing film 125 made of an insulative organic film or multiple layers of an insulative organic film and an inorganic film. The plurality of layers forming the sealing film 125 include a first inorganic sealing layer 231 made of inorganic material such as SiN and SiOx; an organic sealing layer 232 formed on edges of recesses on the first inorganic sealing layer 231 and made of resin such as acrylic resin; and a second inorganic sealing layer 233 formed on the organic sealing layer 232 and made of inorganic material. However, the sealing film 125 is not limited to include the plurality of layers, but may include a single layer. The light-emitting organic layer 132 is formed on the whole surface of the display area 205. However, the light-emitting organic layer 132 may be formed in each of the sub-pixels 212 corresponding to the respective colors of R, G, and B. In this case, the color filter and black matrix layer 151 may not be formed. Moreover, the sealing film 125 may not be multiple layers but a single layer.

For example, when the light-emitting organic layer 132 includes a plurality of light-emitting layers and the light-emitting organic layer 132 has a so-called tandem arrangement, a charge generation layer (CGL) may be deposited between the light-emitting layers. Moreover, the conductive organic film 134 may include a charge generation layer made of a material similar to that of the above-described charge generation layer. Irrespective of whether the light-emitting organic layer 132 has a tandem arrangement or not, the conductive organic film 134 may include a charge generation layer. As the conductive organic material, polymer acetylene, polythiophenes, and a polymer composite can be used. Moreover, PEDOT:PSS [Poly(3,4-ethylenedioxythiophene):Poly(styrenesulfonate)] may be used as the conductive organic material. Further, as the material of the conductive organic film 134, one obtained by adding an inorganic substance having conductivity to a conductive organic material or a non-conductive organic material through simultaneous formation or co-evaporation may be used. As the inorganic substance having conductivity, amorphous carbon or a carbon nanotube can be used. Moreover, quantum dots may be formed. Moreover, performing ion implantation such as of, for example, proton after deposition of the conductive organic film 134 is also effective for improving the conductivity of the conductive organic film 134.

In the drawing showing the cross-section of the edge portion of the organic electroluminescence display device 100 shown in FIG. 3, the sealing film 125 is formed to the edge portion of the organic electroluminescence display device 100 on the passivation film 122 of the TFT substrate 120. The upper electrode 133 is formed to the inside (the display area 205 side) of the edge portion of the organic electroluminescence display device 100, and the conductive organic film 134 is formed to the inside (the display area 205 side) of an edge portion of the upper electrode 133.

Figure 4:
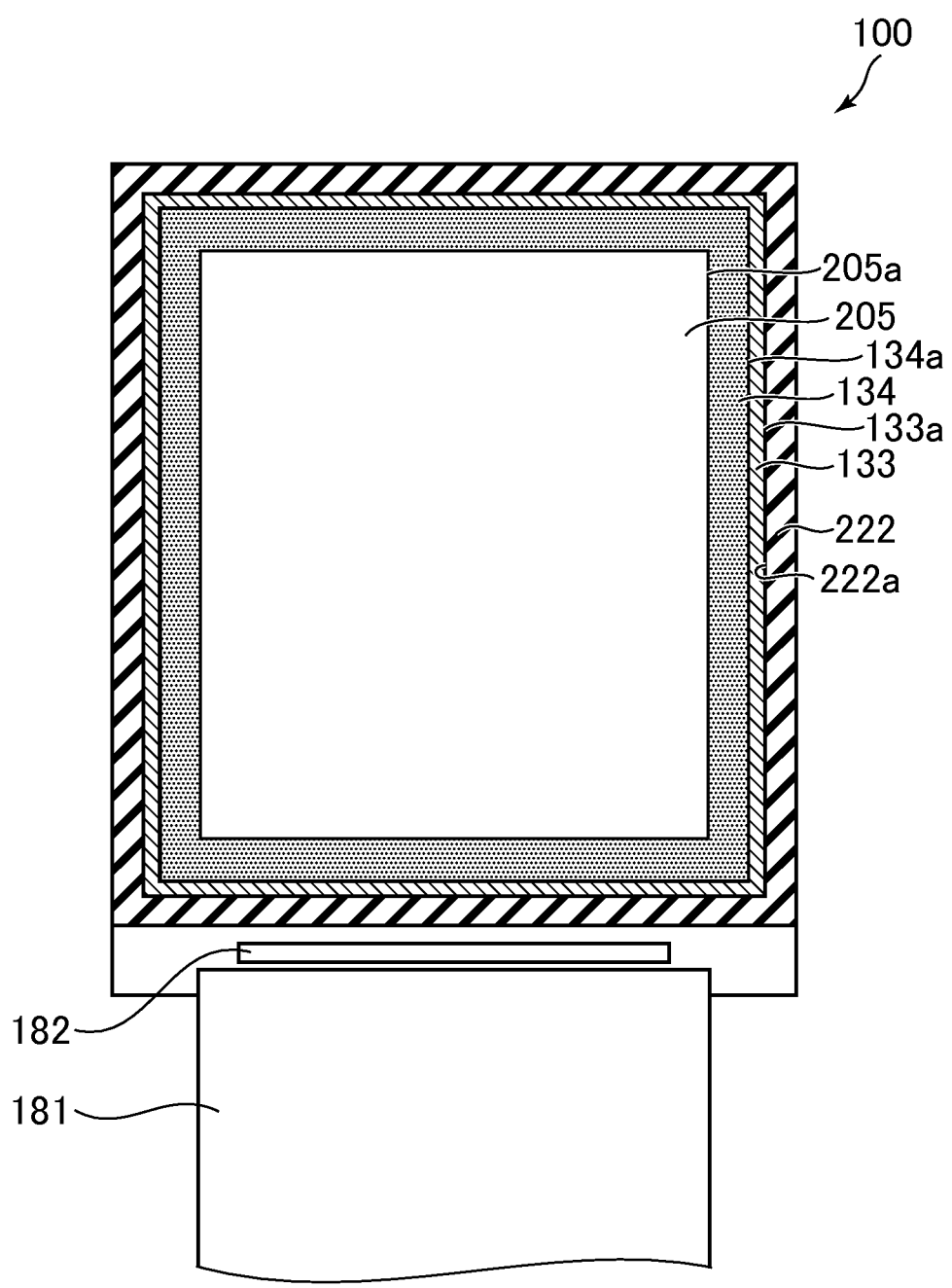
FIG. 4 is a plan view schematically showing areas where a conductive organic film, an upper electrode, and a sealant are arranged.

FIG. 4 is a plan view schematically showing areas where the conductive organic film 134, the upper electrode 133, and the sealant 222 are arranged. For convenience of description, in FIG. 4, the configurations on the outside of the display area 205 are shown by hatching. In an area where the configurations are overlapped each other, only a member arranged on the uppermost side is shown by hatching. As shown in the drawing, an outer perimeter 133a of an area where the upper electrode 133 is deposited is on the outside of an outer perimeter 205a of the display area 205 in the plan view, and is on the inside of an inner perimeter of an area where the sealant 222 is arranged. An outer perimeter 134a of an area where the conductive organic film 134 is deposited is on the outside of the outer perimeter 205a of the display area 205, and is on the inside of the edge (the outer perimeter 133a) of the upper electrode 133. By adopting such a configuration, even when an organic material like the conductive organic film 134 is arranged on the upper electrode 133, the conductive organic film 134 is confined between the sealing film 125 and the upper electrode 133. For this reason, moisture can be prevented from entering the conductive organic film 134. Further, the end portion of the conductive organic film 134 does not extending beyond the upper electrode 133 for the reason that the conductive organic film 134 is formed after the upper electrode 133 is formed. As such, an uneven surface in the conductive organic film 134 is not generated by the upper electrode 133. Accordingly, it is possible to prevent generation of a crack due to the uneven surface. Moreover, the conductivity of the conductive organic film 134 can be made higher than that of a transparent electrode such as of ITO constituting the upper electrode 133. For this reason, since the conductive organic film 134 is formed in contact with the upper electrode 133, the resistance of the upper electrode 133 can be substantially reduced. Hence, by forming the conductive organic film 134 on the upper electrode 133 so as to cover the display area 205, the low resistance of the upper electrode 133 is substantially achieved. For this reason, the potential of a cathode can be maintained even in a bright screen that requires a large current, so that image quality can be improved.

Figure 5:
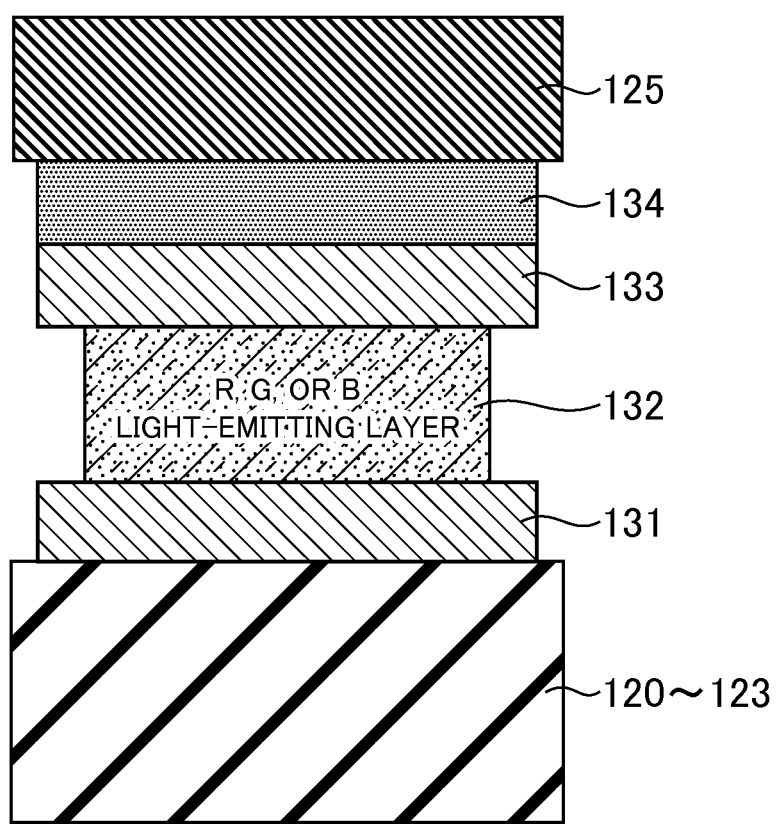
FIG. 5 is a diagram showing the case where any of an R light-emitting layer, a G light-emitting layer, and a B light-emitting layer is formed in a light-emitting organic layer.

FIGS. 5 to 10 are diagrams each schematically showing a configuration example of the light-emitting organic layer 132 and layers stacked in the light-emitting organic layer 132 of the sub-pixel 212. In the drawings, a hole transport layer (HTL) and an electron transport layer (ETL) are not illustrated. FIG. 5 is a diagram showing the case where any of an R light-emitting layer, a G light-emitting layer, and a B light-emitting layer is formed in the light-emitting organic layer 132. As shown in the drawing, the conductive organic film 134 is formed on the upper electrode 133. For this reason, the conductivity of the upper electrode 133 can be substantially increased.

Figure 6:
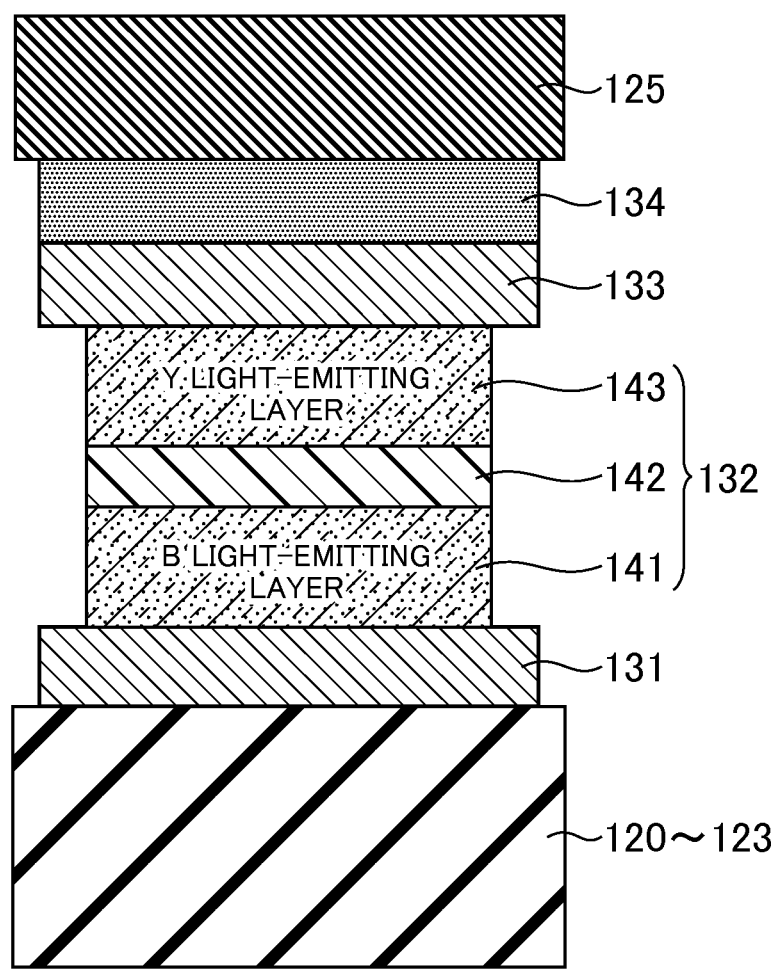
FIG. 6 is a diagram showing the case where the light-emitting organic layer includes the B light-emitting layer and a Y light-emitting layer disposed in a tandem arrangement.

FIG. 6 shows the case where the light-emitting organic layer 132 includes a B light-emitting layer 141 and a Y (yellow) light-emitting layer 143 disposed in a tandem arrangement. In this case, since a charge generation layer 142 is arranged between the B light-emitting layer 141 and the Y light-emitting layer 143, the B light-emitting layer 141 and the Y light-emitting layer 143 can simultaneously emit light. Even in the case of such a configuration, since the conductive organic film 134 is formed on the upper electrode 133, the conductivity of the upper electrode 133 can be substantially increased. In this case, the conductive organic film 134 may be formed of the same material as that of the charge generation layer 142.

Figure 7:
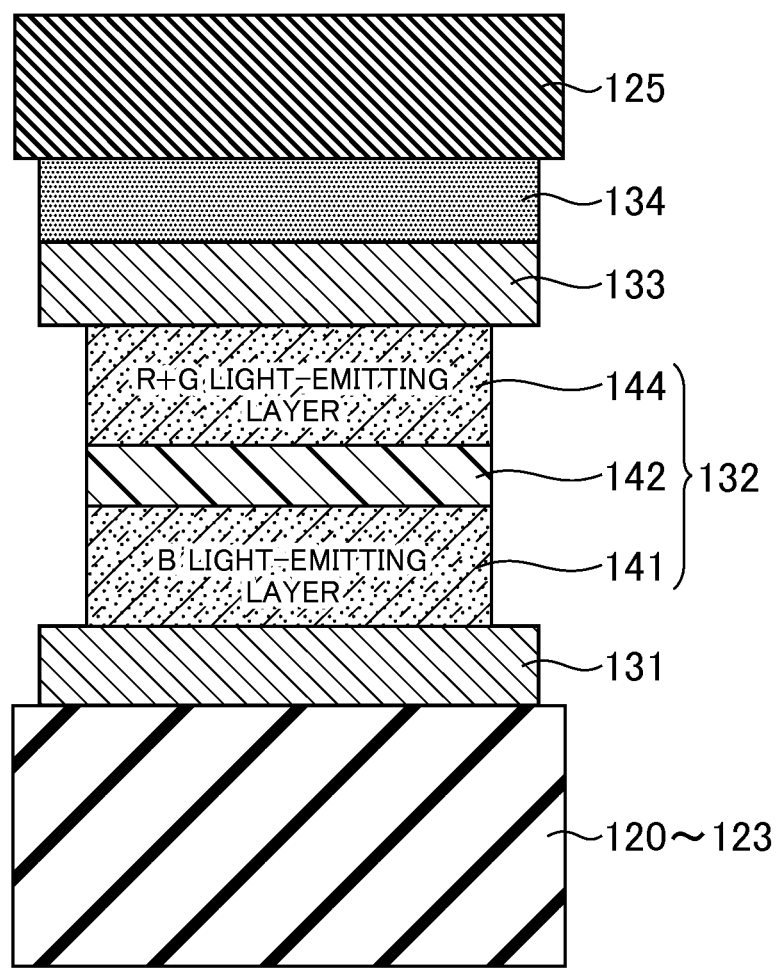
FIG. 7 is a diagram showing the case where the light-emitting organic layer includes the B light-emitting layer and an R+G light-emitting layer disposed in a tandem arrangement.

FIG. 7 shows the case where the light-emitting organic layer 132 includes the B light-emitting layer 141 and an R+G light-emitting layer 144 disposed in a tandem arrangement. In this case, by arranging the charge generation layer 142 between the B light-emitting layer 141 and the R+G light-emitting layer 144, the B light-emitting layer 141 and the R+G light-emitting layer 144 can simultaneously emit light. Even in the case of such a configuration, since the conductive organic film 134 is formed on the upper electrode 133, the conductivity of the upper electrode 133 can be substantially increased. Similarly to FIG. 6, the conductive organic film 134 may be formed of the same material as that of the charge generation layer 142.

Figure 8:
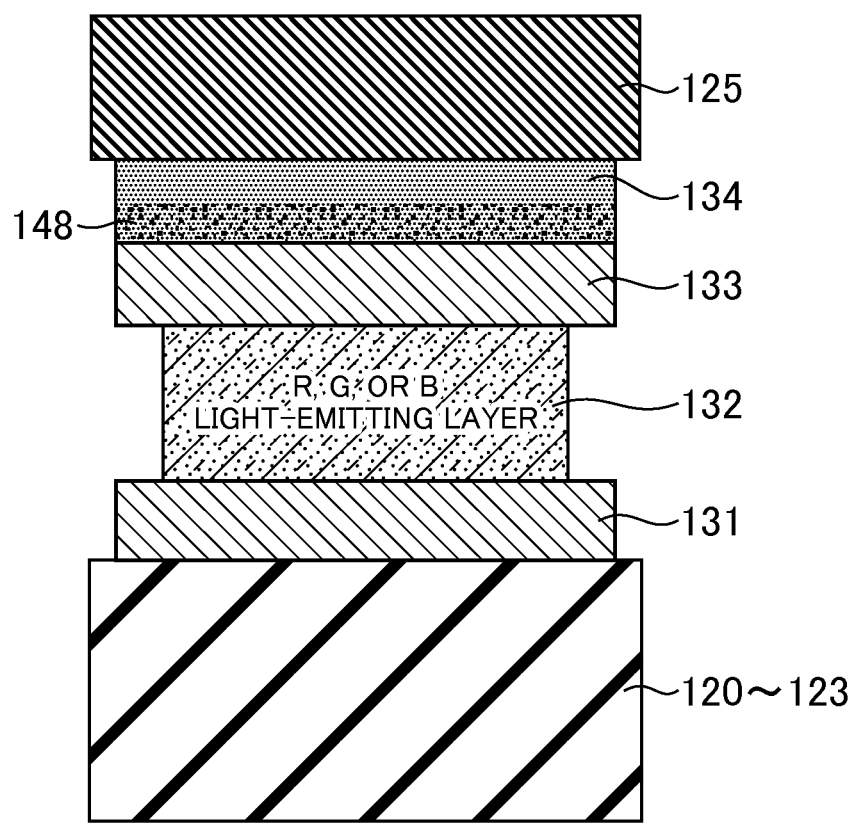
FIG. 8 is a diagram showing the case where ions are injected into a conductive organic film in FIG. 5.
Figure 9:
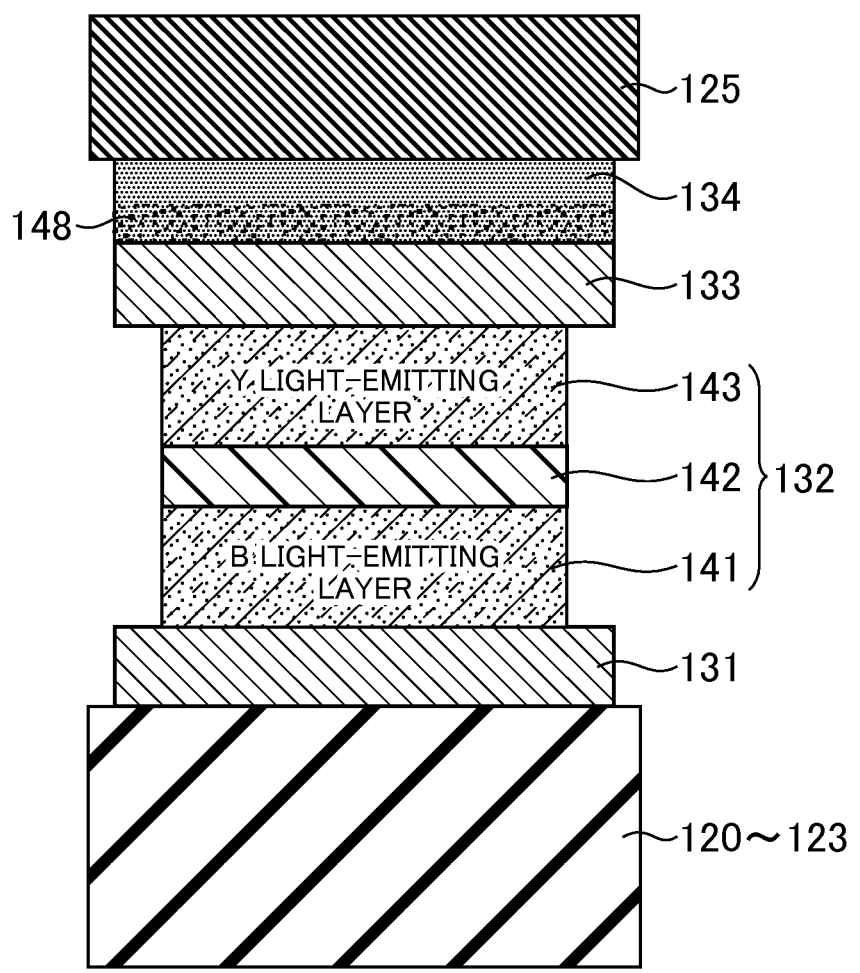
FIG. 9 is a diagram showing the case where ions are injected into a conductive organic film in FIG. 6.
Figure 10:
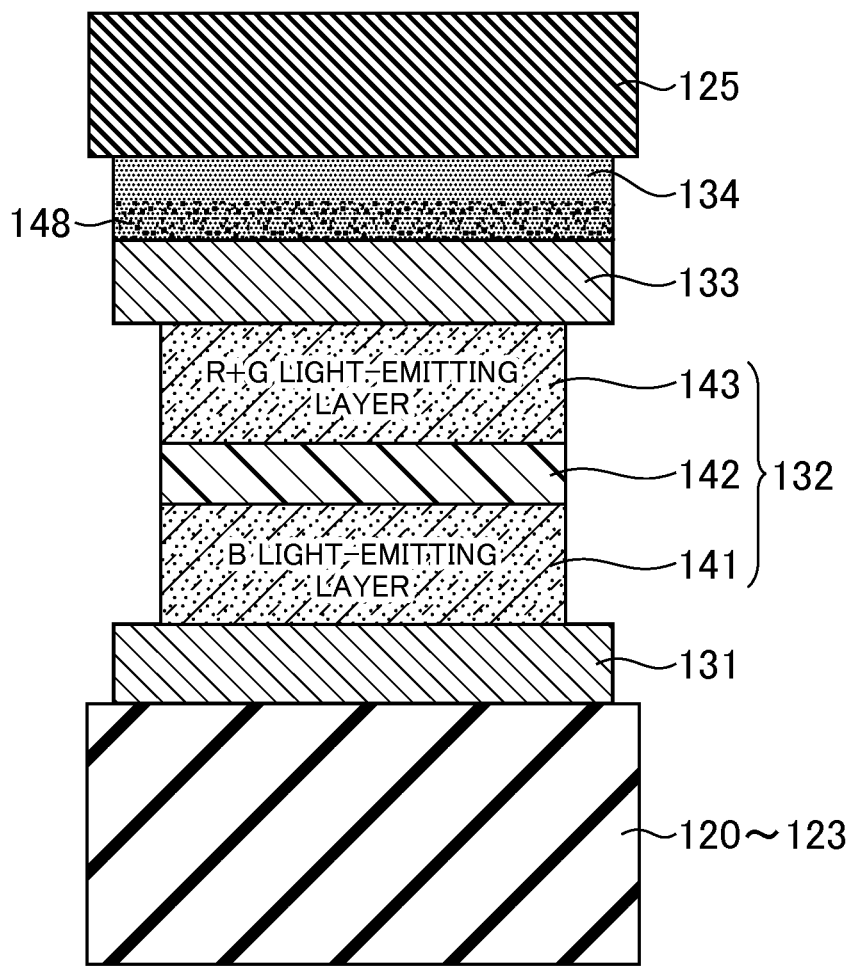
FIG. 10 is a diagram showing the case where ions are injected into a conductive organic film in FIG. 7.

FIGS. 8 to 10 are diagrams showing the cases where ions 148 are injected into the respective conductive organic films 134 in FIGS. 5 to 7. Here, proton, for example, can be used for the ions 148. With such a configuration, the conductivity of the conductive organic film 134 can be further increased. Due to this, the resistance of the upper electrode 133 that is substantially in contact with the conductive organic film 134 can be further reduced.

Figure 11:
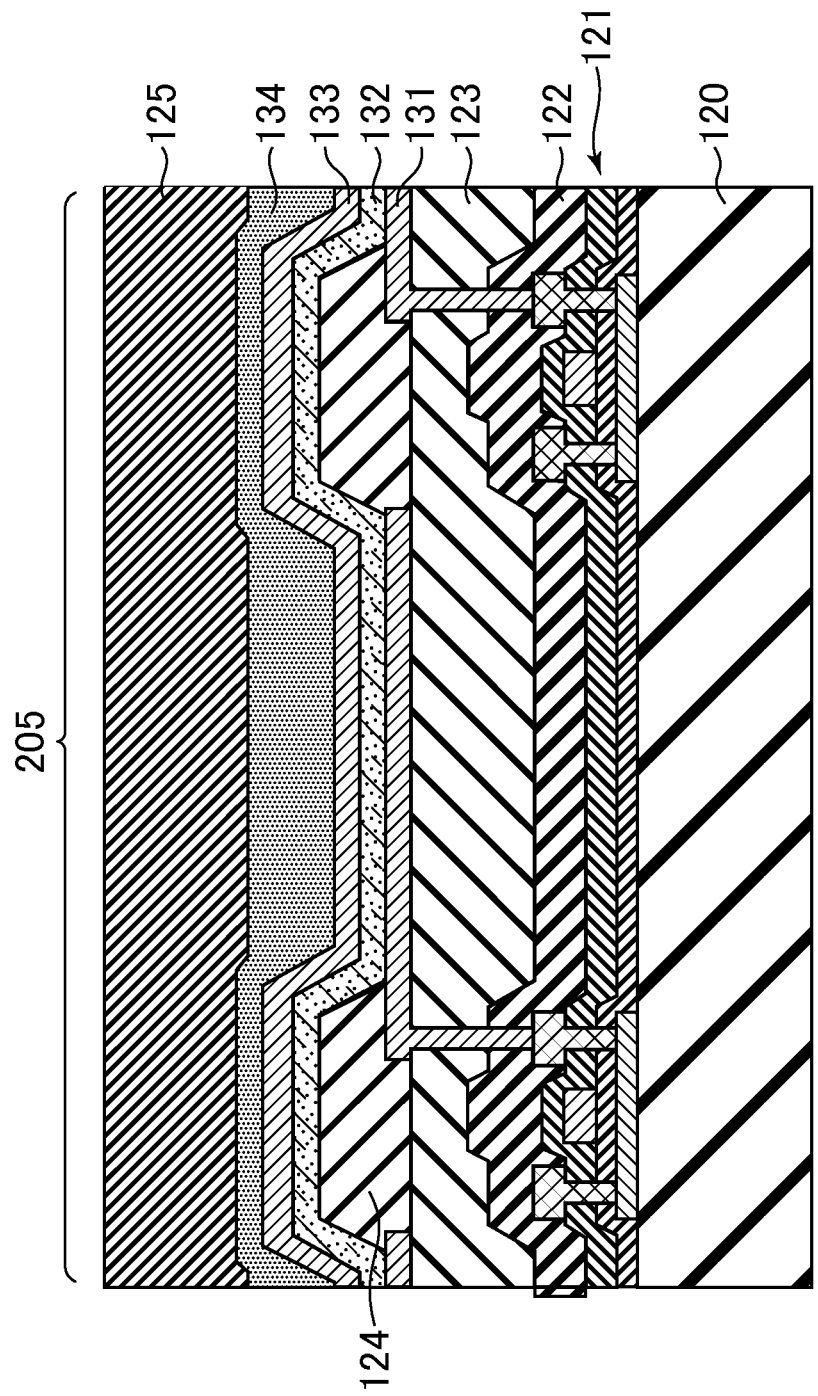
FIG. 11 is a diagram showing the case where the thickness of the conductive organic film is changed.

FIG. 11 is a diagram showing the case where the thickness of the conductive organic film 134 is changed. The conductive organic film 134 in FIG. 11 is formed thick so as to fill steps generated by the pixel separation films 124. Since the conductive organic film 134 is formed thick, the low resistance is achieved, and therefore, the conductivity is increased. For this reason, it is possible to achieve the lower resistance of the upper electrode 133 that is substantially in contact with the conductive organic film 134.

Figure 12:
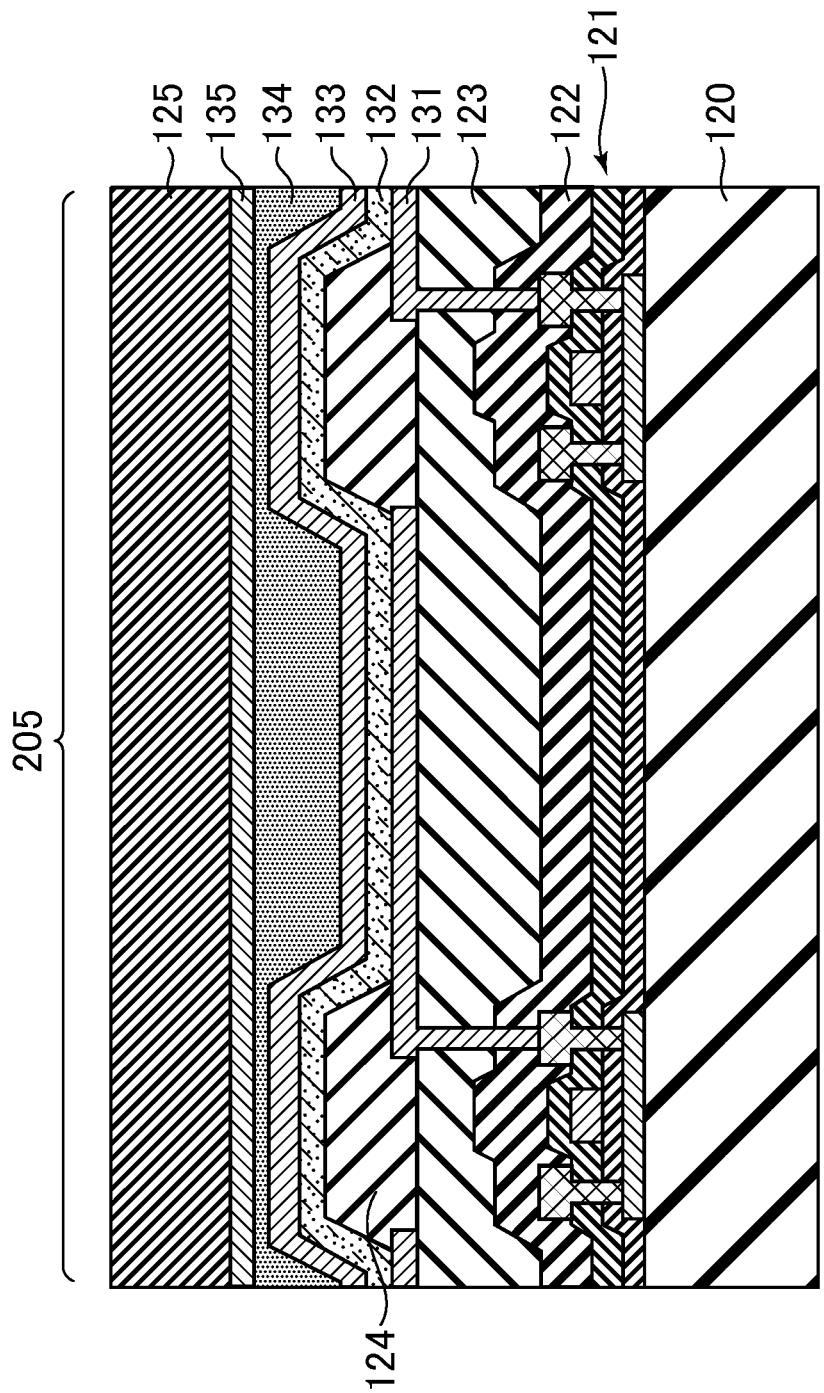
FIG. 12 is a diagram showing another case where the thickness of the conductive organic film is changed.

FIG. 12 is a diagram showing another case where the thickness of the conductive organic film 134 is changed. In this case, the conductive organic film 134 fills the steps generated by the pixel separation films 124, and in addition, an upper surface of the conductive organic film 134 is planarized, which is different from the case of FIG. 11. Further, a transparent conductive film 135 made of a conductive inorganic material such as ITO is formed on the conductive organic film 134 so as to cover the display area 205. With such a configuration, the low resistance of the upper electrode 133 can be substantially achieved, and an upper surface of the transparent conductive film 135 can be planarized. When the sealing film 125 is formed of a plurality of layers, the number of layers constituting the sealing film 125 can be reduced due to the planarization.

In the embodiment described above, the plurality of layers forming the sealing film 125 include the first inorganic sealing layer 231, the organic sealing layer 232, and the second inorganic sealing layer 233. However, the first inorganic sealing layer 231 and the organic sealing layer 232 may be eliminated by utilizing the conductive organic film 134. The reason is as follows. The first inorganic sealing layer 231 normally prevents external moisture from penetrating into the light-emitting organic layer 132. However, in a case where an extraneous particle or the like exists on a layer on which the first inorganic sealing layer 231 is formed, the first inorganic sealing layer 231 is not formed sufficiently on the periphery around the particle, which may cause penetration of moisture. Further, in some cases, the first inorganic sealing layer 231 is not formed sufficiently in recesses formed due to the edges of the pixel separation film 124. For the above reasons, the TFT substrate 120 is provided with the organic sealing layer 232 that is formed comparatively well on positions on which the first inorganic sealing layer 231 is not sufficiently formed, such as the periphery around the extraneous particle or the recesses formed due to the edges of the pixel separation film 124. Moreover, the organic sealing layer 232 can planarize the unevenness caused in the periphery around the extraneous particle or caused by the recesses formed due to the edges of the pixel separation film 124. As such, there is no position where the second inorganic sealing layer 233 is insufficiently formed and penetration of external moisture is prevented enough. The first inorganic sealing layer 231 prevents moisture of the organic sealing layer from causing a harmful effect on the light-emitting organic layer 132.

The conductive organic film 134 is provided in the embodiment described above. The conductive organic film 134 is well formed on positions on which the first inorganic sealing layer 231 is not sufficiently formed, such as the periphery around the extraneous particle or the recesses formed due to edges of the pixel separation film 124. Accordingly, the organic sealing layer 232 may be eliminated. Further, the elimination of the organic sealing layer 232 solves a concern about the moisture from the organic sealing layer 232, and thus the first inorganic sealing layer 231 can be eliminated. In particular, moisture is hardly generated from the conductive organic film 134 made of any of the above described materials, such as, polymer acetylene, polythiophenes, a polymer composite, PEDOT:PSS, conducive charge generation layer (CGL: Charge Generation Layer). Accordingly, the conductive organic film 134 can improve the light-emitting organic layer 132 in durability, quality, and reliability.

In particular, in the structure as shown in FIGS. 11 and 12 where the conductive organic film 134 is formed for planarization, the planarization eliminates the deficient forming of the sealing film 125 that is caused by the extraneous particle and the recesses formed due to edges of the pixel separation film 124. This improves barrier against moisture and enables elimination of the first inorganic sealing layer 231 and the organic sealing layer 232 without any problems.

In a case where it is not possible to compensate the deficient forming of the sealing film 125, which is caused by the extraneous particle and the recesses formed due to the edges of the pixel separation film 124, by the planarization by the conductive organic film 134 and the conductive organic film 134 formed around an extraneous particle, the first inorganic sealing layer 231 and the organic sealing layer 232 may be provided in the sealing film 125. The sealing film 125 may consist of the second inorganic sealing layer 233 and the organic sealing layer 232 in a case where influence caused by moisture from the organic sealing layer 232 is negligibly small, even if it is not possible to compensate the deficient forming of the sealing film 125, which is caused by the extraneous particle and the recesses formed due to the edges of the pixel separation film 124, by the planarization by the conductive organic film 134 and the conductive organic film 134 formed around an extraneous particle.

The embodiment described above is not limited to a structure including the sealing film, but may be applied to a structure not including the sealing film. Further, the conductive organic film 134 may have a function to reflect, or absorb, ray at a specific wavelength. A conductive organic film having a function to block energy ray (for example, ultraviolet ray, infrared ray, and electron ray) can reduce influence of the energy adversely affecting the light-emitting organic layer 132 from outside light irradiated in use and in manufacturing. That can stabilize devices and improve durability of devices. Further, the refractive indexes are gradually changed in a process where light emitted from the light-emitting organic layer 132 passes through the conductive organic film 134 and the upper electrode 133, so that the efficiency in light emission can be improved and a device that has high efficiency can be achieved.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An organic electroluminescence display device comprising:
    a lower electrode that is made of a conductive inorganic material and formed in each of sub-pixels arranged in a matrix in a display area;
    a light-emitting organic layer that is in contact with the lower electrode and made of a plurality of different organic material layers including a light-emitting layer emitting light;
    an upper electrode that is in contact with the light-emitting organic layer, formed so as to cover the whole of the display area, and made of a conductive inorganic material;
    a conductive organic layer that is in contact with the upper electrode, formed so as to cover the whole of the display area, and made of a conductive organic material; and
    a conductive inorganic film that is in contact with a surface of the conductive organic layer on the side opposite to a surface thereof on which the upper electrode is formed, formed to cover the whole of the display area, and made of a conductive inorganic material.

2. The organic electroluminescence display device according to claim 1, wherein
    the conductive organic layer is formed on the inside of the upper electrode in a plan view.

3. The organic electroluminescence display device according to claim 1, further comprising, on the conductive organic layer, a sealing film that covers the outsides of the conductive organic layer and the upper electrode in the plan view and is made of an inorganic material.

4. The organic electroluminescence display device according to claim 1, wherein
    the conductive organic layer planarizes irregularities of the upper electrode.

5. The organic electroluminescence display device according to claim 1, wherein
    the light-emitting organic layer has a configuration in which a plurality of the light-emitting layers are disposed in a tandem arrangement, and a charge generation layer is arranged between the plurality of light-emitting layers.

6. The organic electroluminescence display device according to claim 1, wherein
    an inorganic substance for increasing conductivity is added to a material of the conductive organic layer.

7. The organic electroluminescence display device according to claim 1, wherein the conductive organic layer includes ions injected after deposition.

8. An organic electroluminescence display device comprising:
- a lower electrode that is made of a conductive inorganic material and formed in each of sub-pixels arranged in a matrix in a display area;
- a light-emitting organic layer that is in contact with the lower electrode and made of a plurality of different organic material layers including a light-emitting layer emitting light;
- an upper electrode that is in contact with the light-emitting organic layer, formed so as to cover the whole of the display area, and made of a conductive inorganic material; and
- a conductive organic layer that is in contact with the upper electrode, formed so as to cover the whole of the display area, and made of a conductive organic material,
- wherein the conductive organic layer is formed of a charge generation layer.

9. The organic electroluminescence display device according to claim 8, wherein the conductive organic layer is formed on the inside of the upper electrode in a plan view.

10. The organic electroluminescence display device according to claim 8, further comprising, on the conductive organic layer, a sealing film that covers the outsides of the conductive organic layer and the upper electrode in the plan view and is made of an inorganic material.

11. The organic electroluminescence display device according to claim 8, wherein the conductive organic layer planarizes irregularities of the upper electrode.

12. The organic electroluminescence display device according to claim 8, wherein the light-emitting organic layer has a configuration in which a plurality of the light-emitting layers are disposed in a tandem arrangement, and a charge generation layer is arranged between the plurality of light-emitting layers.

13. The organic electroluminescence display device according to claim 8, wherein an inorganic substance for increasing conductivity is added to a material of the conductive organic layer.

14. The organic electroluminescence display device according to claim 8, wherein the conductive organic layer includes ions injected after deposition.

* * * * *